(12) United States Patent
Gower et al.

(10) Patent No.: US 6,952,240 B2
(45) Date of Patent: Oct. 4, 2005

(54) IMAGE SAMPLING CIRCUIT WITH A BLANK REFERENCE COMBINED WITH THE VIDEO INPUT

(75) Inventors: Richard L. Gower, San Jose, CA (US); Eric G. Hoffman, Fremont, CA (US); Bhupendra K. Ahuja, Fremont, CA (US); J. Antonio Salcedo, Livermore, CA (US)

(73) Assignee: Exar Corporation, Fremont, CA (US)

( * ) Notice: Subject to any disclaimer, the term of this patent is extended or adjusted under 35 U.S.C. 154(b) by 1037 days.

(21) Appl. No.: 09/860,905

(22) Filed: May 18, 2001

(65) Prior Publication Data

US 2002/0171773 A1 Nov. 21, 2002

(51) Int. Cl.[7] .............................. H04N 5/52; H04N 5/20
(52) U.S. Cl. ...................... 348/678; 348/689; 348/707; 348/673; 348/255; 348/257; 348/572; 330/254; 341/172
(58) Field of Search ................................. 348/678, 689, 348/677, 673, 674, 685, 690, 691, 572, 707, 705, 255, 257, 243; 330/294, 9; 327/560, 306, 307, 309, 563; 379/390.03, 390.01; 341/155, 172, 139

(56) References Cited

U.S. PATENT DOCUMENTS

| 4,287,441 A | 9/1981 | Smith ......................... 307/353 |
| 4,697,152 A * | 9/1987 | Westwick ....................... 330/9 |

(Continued)

OTHER PUBLICATIONS

Lewis, Stephen H., "Optimizing the Stage Resolution in Pipelined, Multistage, Analog–to–Digital Converters for Video–Rate Applications," IEEE Transactions on Circuits and Systems–II: Analog and Digital Signal Processing, vol. 39, No. 8, pp. 516–523, Aug. 1992.

Mangelsdorf, C., et al., "A CMOS Front–End for CCD Cameras," 1996 IEEE International Solid–State Circuits Conference, pp. 190–191, 1996.

Abo, Andrew M., et al., "A 1.5–V, 10–bit, 14.3–MS/s CMOS Pipeline Analog–to–Digital Converter," IEEE Journal of Solid–State Circuits, vol. 34, No. 5, May 1999.

Kasha, Dan B. et al., "A 16–mW, 120–dB Linear Switched–Capacitor Delta–Sigma Modulator with Dynamic Biasing," IEEE Journal of Solid–State Circuits, vol. 34, No. 7, pp. 921–925, Jul. 1999.

Nakamura, K., et al., "A CMOS Analog Front End Chip–Set for Mega Pixel Camcorders," 2000 IEEE International Solid–State Circuits Conference, pp. 190–191, 2000.

*Primary Examiner*—John Miller
*Assistant Examiner*—Jean W. Désir
(74) *Attorney, Agent, or Firm*—Townsend and Townsend and Crew LLP (57) ABSTRACT

A programmable gain amplifier having three separately programmable amplifiers. A programmable transconductance amplifier is followed by a programmable transimpedance amplifier, then a programmable switched capacitor amplifier. In one embodiment, this programmable gain amplifier is implemented in an analog front-end (AFE) circuit. One AFE embodiment provides a coarse pre-gain offset a black reference level sampler, and a fine post-gain offset in the programmable switched capacitor amplifier. In one embodiment, an ADC reference is sampled, and is subtracted directly from the video signal in the switched capacitor amplifier so that the zero level of the video signal is made to correspond to the zero level of the ADC. In another embodiment, a piece-wise linear approximation of an exponential gain function is implemented by programming the transconductance and transimpedance amplifiers to provide exponential jumps in gain, while the switched capacitor amplifier is programmed to interpolate as needed between the exponential gain levels.

13 Claims, 8 Drawing Sheets

U.S. PATENT DOCUMENTS

| | | | | |
|---|---|---|---|---|
| 5,363,102 A | * | 11/1994 | Ferguson, Jr. | 341/172 |
| 5,703,524 A | | 12/1997 | Chen | 327/560 |
| 5,796,361 A | | 8/1998 | Levinson | 341/172 |
| 5,936,469 A | * | 8/1999 | Alexander et al. | 330/258 |
| 5,982,230 A | * | 11/1999 | MacBeth | 330/9 |
| 6,002,299 A | * | 12/1999 | Thomsen | 330/9 |
| 6,018,269 A | | 1/2000 | Viswanathan | 330/254 |
| 6,025,875 A | | 2/2000 | Vu et al. | 348/241 |
| 6,037,887 A | * | 3/2000 | Wu et al. | 341/143 |
| 6,307,497 B1 | * | 10/2001 | Leung et al. | 341/155 |
| 6,587,142 B1 | * | 7/2003 | Kozlowski et al. | 348/241 |
| 6,657,488 B1 | * | 12/2003 | King et al. | 330/9 |
| 6,791,607 B1 | * | 9/2004 | Bilhan et al. | 348/243 |
| 6,873,703 B1 | * | 3/2005 | Enriquez | 379/399.01 |

* cited by examiner

IMAGE SAMPLING CIRCUIT WITH A BLANK REFERENCE COMBINED WITH THE VIDEO INPUT

BACKGROUND OF THE INVENTION

The present invention relates to an analog front-end (AFE) for an imaging sensor, and in particular to a correlated double sampler (CDS), programmable gain amplifier (PGA), and sample and hold circuit (S/H) for CCD signal digitization.

Imaging systems which may support a CCD sensor or a CMOS sensor typically require an AFE chip which samples the analog signal under control of a timing generator. Typically, a voltage amplifier is used. The sampled signal is then amplified and provided to a separate chip for digitization and subsequent processing.

Typically, a black reference level is sampled immediately before every pixel of a video signal. These two values are then separately provided to the digital processing circuitry. Related prior art is described below:

U.S. Pat. No. 5,796,361. This patent describes a single chip, cost effective implementation of a CCD signal digitizing circuit which uses a standard technique to correct for the pixel-to-pixel variation of the black reference level.

U.S. Pat. No. 4,287,441. This patent describes a high speed correlated double sampling amplifier.

U.S. Pat. No. 5,703,524. This Exar patent describes a Piece-Wise Linear Approximation of a DB linear Programmable Gain Amplifier.

U.S. Pat. No. 6,018,269. This Texas Instruments, Inc. patent shows a Programmable Gain Amplifier with transimpedance and transconductance amplifiers.

U.S. Pat. No. 6,025,875. This National Semiconductor patent shows an Analog Signal Sampler for Imaging Systems.

SUMMARY OF THE INVENTION

The present invention provides a programmable gain amplifier having three separately programmable amplifiers. First, a programmable transconductance amplifier is used. This is followed by a programmable transimpedance amplifier. Finally, a programmable switched capacitor amplifier is used.

In one embodiment, this programmable gain amplifier is implemented in an analog front-end (AFE) circuit. In the AFE embodiment, a differential input is provided to a DC restore clamp, then to a black reference level sampler circuit, and then to the programmable gain amplifier.

The use of a transconductance amplifier provides the ability to improve the signal to noise ratio by maximizing the ratio of the signal current to the constant bias current, within the constraints of allowable power dissipation. This amplifier is not limited by the supply voltage, as are prior art voltage amplifiers. In addition, the combination of a transconductance and trans impedance amplifier allows the gain to be changed without adversely affecting the bandwidth. Traditional operational amplifiers cannot accommodate a wide bandwidth over a significantly changing range of gains.

One embodiment of the invention also provides for both coarse and fine offset adjustment, by providing both pre- and post-gain offset adjustments. In the AFE embodiment, the coarse offset is provided in the black reference level sampler, and the fine offset is provided in the programmable switched capacitor amplifier. The voltage reference of the black reference sampler is two separate voltage references. Each of these voltage references can be independently programmed through a digital-to-analog converter (DAC) input from the external digital processing circuitry. This thus allows pre-gain offset correction to be combined with the black reference signal.

In one embodiment, the zero level of the video signal is made to correspond to the zero level of an analog to digital converter (ADC) in the switched capacitor amplifier. The ADC reference is sampled, and is subtracted directly from the video signal in the switched capacitor amplifier.

In yet another embodiment, the invention implements a piece-wise linear approximation of an exponential gain function. The transconductance and transimpedance amplifiers are programmed to provide exponential jumps in gain, while the switched capacitor amplifier is programmed to interpolate as needed between the gain levels of the transconductance and transimpedance amplifiers. The selection circuitry and resistor values are chosen to enable an even multiple of the gain to be selected by changing only certain most significant bits (MSBs) of the gain control register, simplifying user programmability.

For a further understanding of the nature and advantages of the invention, reference should be made to the following description taken in conjunction with the accompanying drawings.

DESCRIPTION OF THE SPECIFIC EMBODIMENTS

Figure 1:
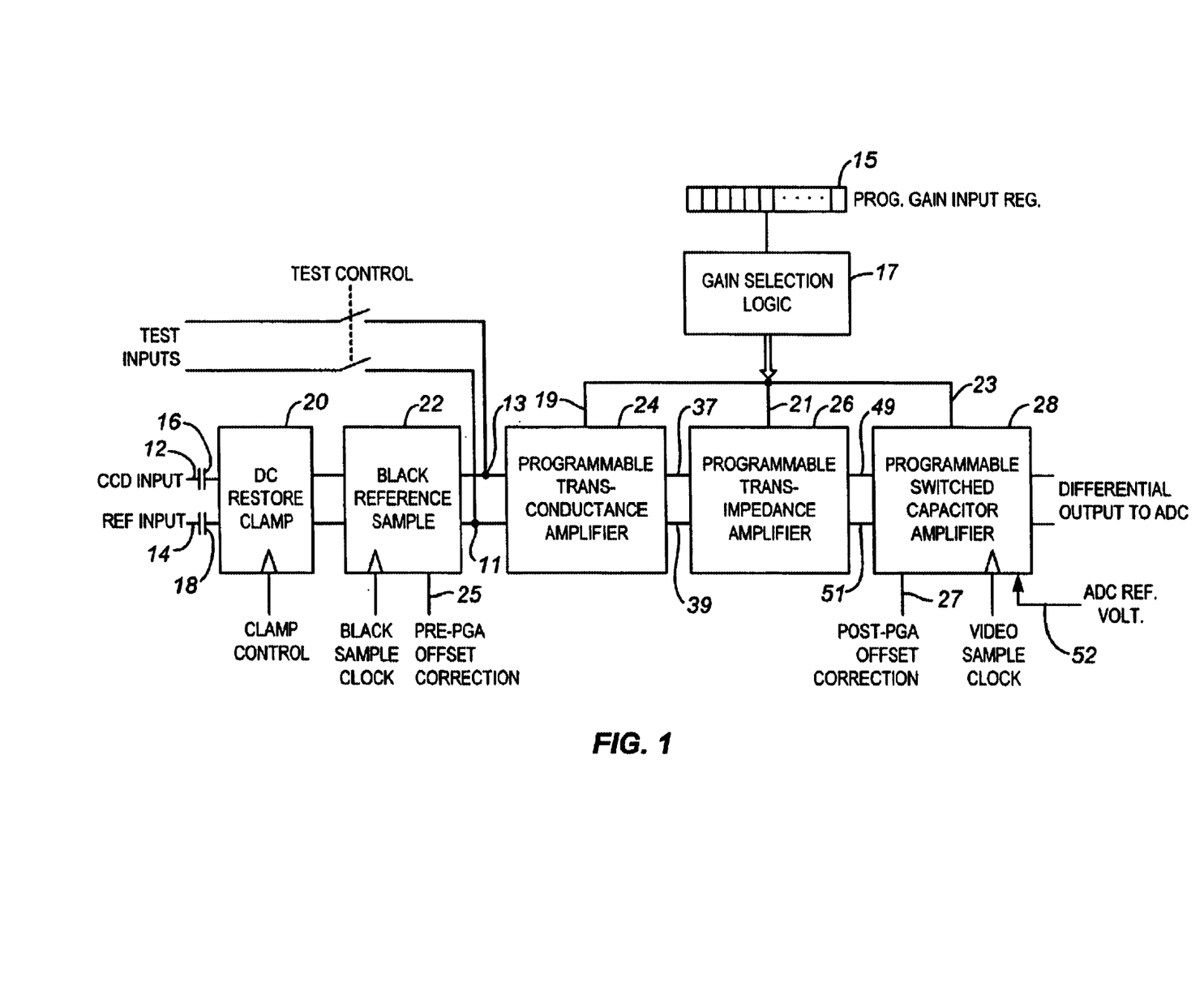
FIG. 1 is a block diagram of an AFE according to an embodiment of the invention.

FIG. 1 illustrates an AFE according to the invention. A CCD input is provided on a line 12, with a reference input being provided on a line 14. These are connected through external capacitors 16 and 18, respectively, to a DC restore clamp 20. The output of DC restore clamp 20 is provided to a black reference sampler circuit 22 according to this invention.

The output of the black reference sampler circuit is provided to a programmable transconductance amplifier 24, which is coupled to a programmable transimpedance amplifier 26, which in turn is coupled to a programmable switched capacitor amplifier 28. The AFE is designed to convert the CCD output signal into a corrected signal for an analog-to-digital converter (ADC) by performing gain, offset correction and elimination of pixel-to-pixel variations.

The gain is programmed by a value input by a user to a programmable gain input register 15. This value is provided to gain selection logic 17, which determines the appropriate gain settings for the three amplifiers, and provides appropriate control signals on lines 19, 21 and 23. Multiples of the gain are provided by the transconductance amplifier 24 and the transimpedance amplifier 26. Interpolation between those multiples, as needed, is provided by switched capacitor amplifier 28.

The coarse offset correction is controlled by line 25 to black reference sampler 22, to provide a pre-gain offset correction. A fine offset correction is provided post-gain in switched capacitor amplifier 28 by control input 27.

The zero level of the video signal at the switched capacitor amplifier 28 is made to correspond to the zero level of an analog to digital converter (ADC) in the switched capacitor amplifier. The ADC reference is sampled, and is subtracted directly from the video signal in the switched capacitor amplifier, using ADC reference input 52.

Figure 2A:
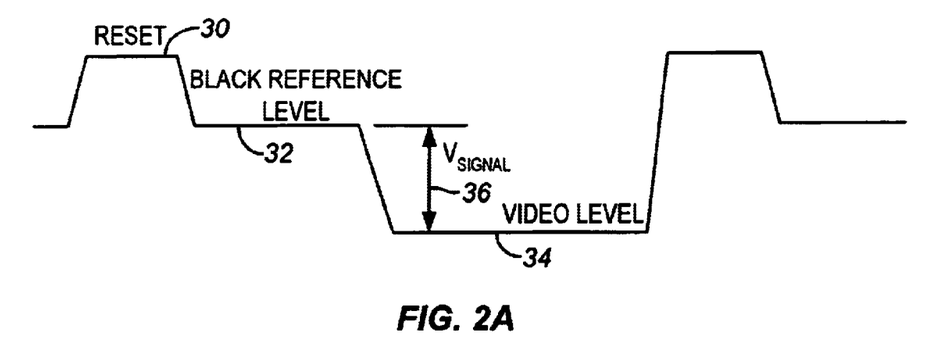
FIG. 2A is a timing diagram illustrating the black reference and video level signals.

FIG. 2A is a timing diagram illustrating the CCD input signals provided to the circuit of FIG. 1. Shown first is a reset signal pulse 30. This is done for each pixel sampled. It is followed by a black reference level signal 32. Subsequently, the video signal 34 is provided. The value of the video signal is indicated by arrows 36 as the difference between the video level and the black reference level. This series of three levels repeats itself for each pixel. The black reference level corresponds to the pixel information when no light is present. The final (video level) period corresponds to the video signal containing the pixel brightness information.

Figure 2B:
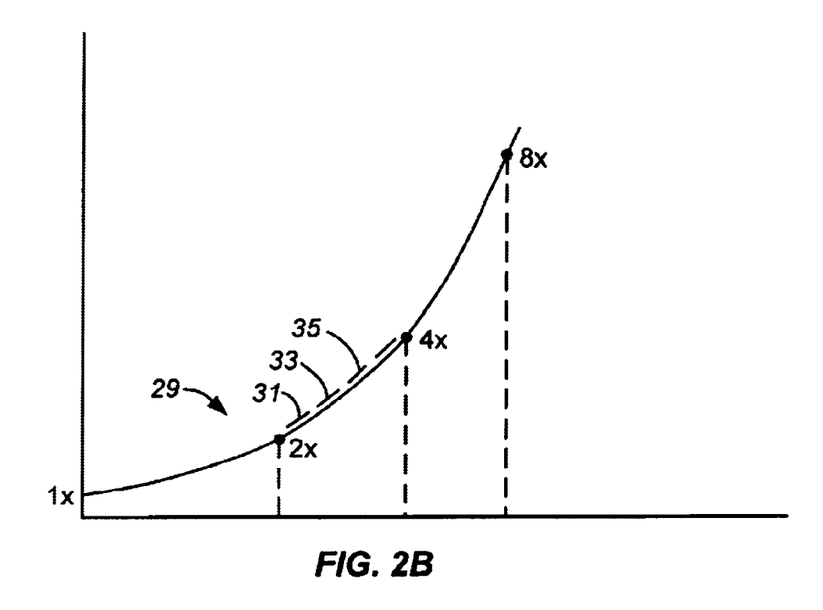
FIG. 2B is a graph illustrating the piece-wise linear approximation of an exponential function, with the power of two gain factors being set by an MSB of the programmable gain input.

FIG. 2B shows an exponential gain curve 29. The gain is set to points corresponding to multiples of 2 (base 2), as illustrated by points 2×, 4× and 8×. To set values of gain between these multiples, the switched capacitor gain is set to interpolate, with a piece-wise approximation to the exponential curve indicated by lines 31, 33 and 35. The number of pieces can be varied according to the desired design. By the appropriate configuration of the selection logic and values of resistors in the amplifiers, the gain can be set to double in response to the change of just one or a few MSBs of the input gain value in the programmable gain input register. This simplifies the programming for users, and also makes it more intuitive for users of digital cameras, who are used to the doubling feature of f-stops in traditional cameras. For additional details on implementing a piece-wise linear approximation of an exponential gain reference is made to U.S. Pat. No. 5,703,524, the disclosure of which is incorporated herein by reference.

Figure 3:
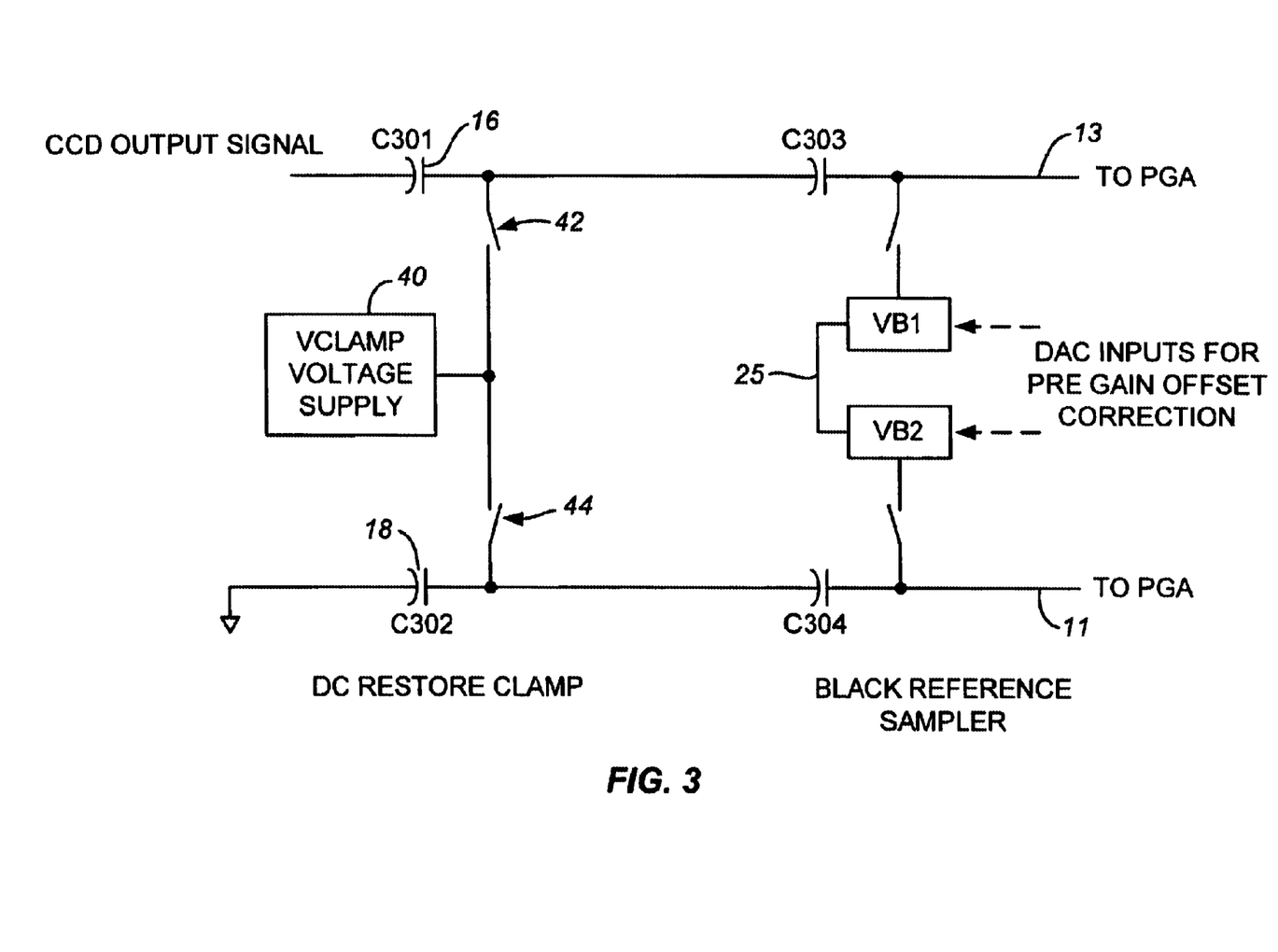
FIG. 3 is a block diagram illustrating the black reference sampler circuit connected to a DC restore clamp.

The DC restore clamp 20 in FIG. 1 is used to provide an offset which is sampled once per line of the CCD. FIG. 3 is a diagram of a DC restore clamp and black reference sampler circuits. The purpose of the DC restore clamp is to set the common mode voltage at the input of the sampling circuit. The CCD signal is a single ended signal with the common mode voltage usually determined by the manufacturer of the CCD. To improve the noise, a differential signal must be created. The CCD signal and an external reference (usually ground) are applied through two external capacitors, C16 and C18. The clamping circuit consists of a low impedance voltage reference 40 and switches 42, 44 controlled with external circuitry. The Vclamp switches 42, 44 are closed during a known period of optically black pixels to establish the Vclamp voltage onto the circuit side of the external capacitors. When the clamp function is disabled, the CCD signal is coupled to an internal capacitor C303 and the other reference input to internal capacitor C304, which are then connected to a sampling circuit.

Black Reference Sampler. The purpose of the sampling circuit function is to sample the voltage during the black reference period of the CCD output signal. By closing the sampling switch during this period, the black level voltage is forced onto one side of C303 and a low impedance source, VB1, is forced onto the other side. At the same time, C304 samples the external reference with respect to another low impedance reference voltage, VB2. By controlling (through control line 25) the difference between VB1 and VB2, a pre-gain offset can be introduced into the signal path. This offset could be used to correct for the difference between the CCD reference voltage and the CCD optically black output signal or the input referred offset of the PGA amplifier. This pre-gain voltage correction is usually supplied by a digital-to-analog (DAC) converter and several control algorithms could be used to determine the amount of correction. The black reference sampler also has the means to be bypassed and a differential input to be supplied to the transconductance amplifier.

Figure 4:
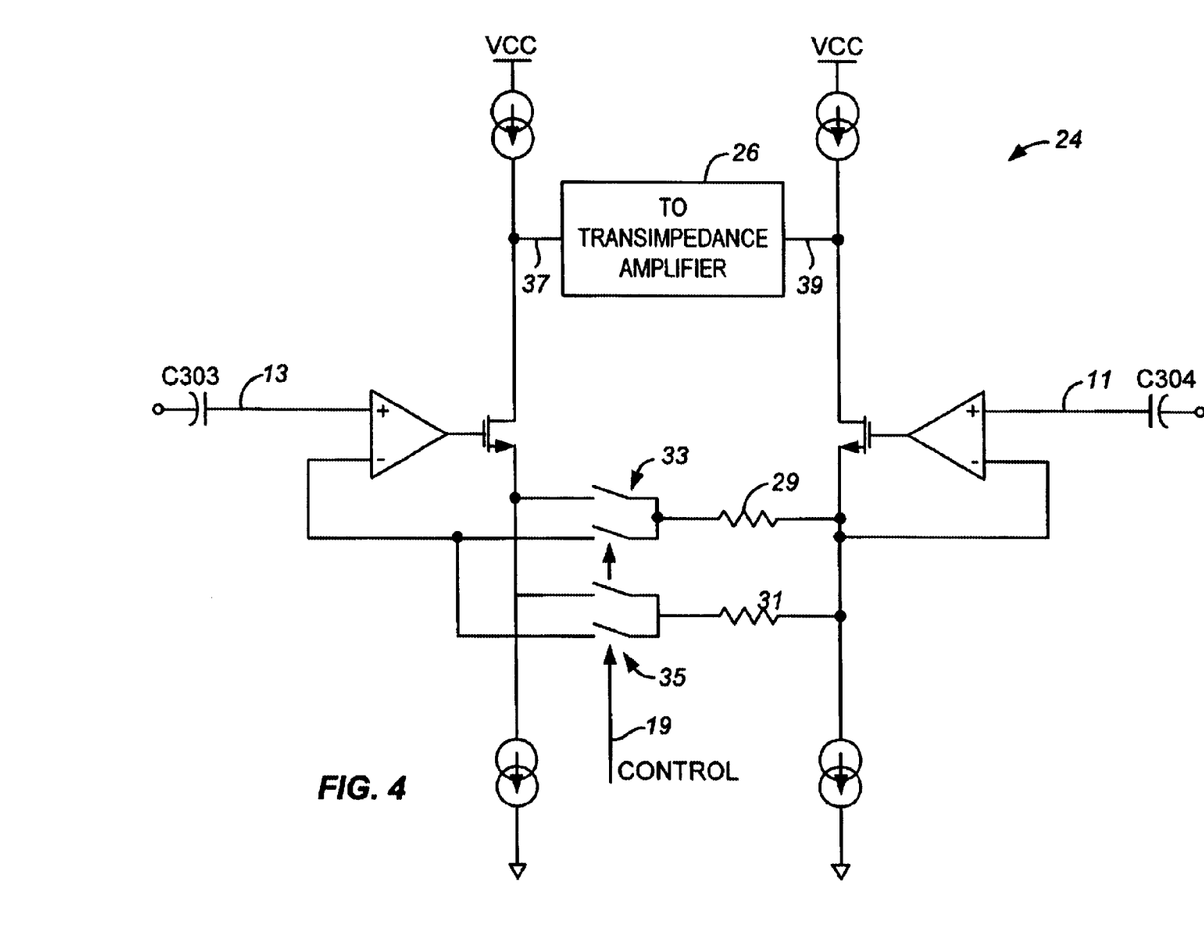
FIG. 4 is a diagram of an embodiment of the transconductance amplifier of FIG. 1.

Transconductance Amplifier. FIG. 4 illustrates one embodiment of the transconductance amplifier. This first stage of the PGA helps keep the noise on the output low by first converting the signal voltage of the CCD input into a current. By maximizing the signal current to the constant bias current we can maximize the signal to noise ratio of the current. This is done by increasing the signal current, compared to the bias current, as much as possible, within the design's power dissipation limits. This minimizes the noise without being limited by the voltage supply level, as in traditional operational amplifiers. This is increasingly important as new designs use lower voltage levels, such as the 3 volt and lower circuit designs.

The topology used also has the advantage of maintaining a high bandwidth because the voltage gain is constant, independent of the gain selected. As the maximum amplitude of the input signal is decreased a lower gain determining resistor can be selected to maintain the signal current at its maximum value. Two such resistors 29 and 31 are illustrated, but any other number could be used. Since the gain selection switches (33, 35) are in series with the output (37, 39), and in the feedback loop of the amplifier, the voltage to current gain is primarily determined by the selected resistor. The gain matching is therefore primarily determined by resistor matching. By using exponential ratios for the resistors, the gain will be exponential. By choosing a power of two exponential variation, an exact power of two change in gain can be achieved.

Figure 5:
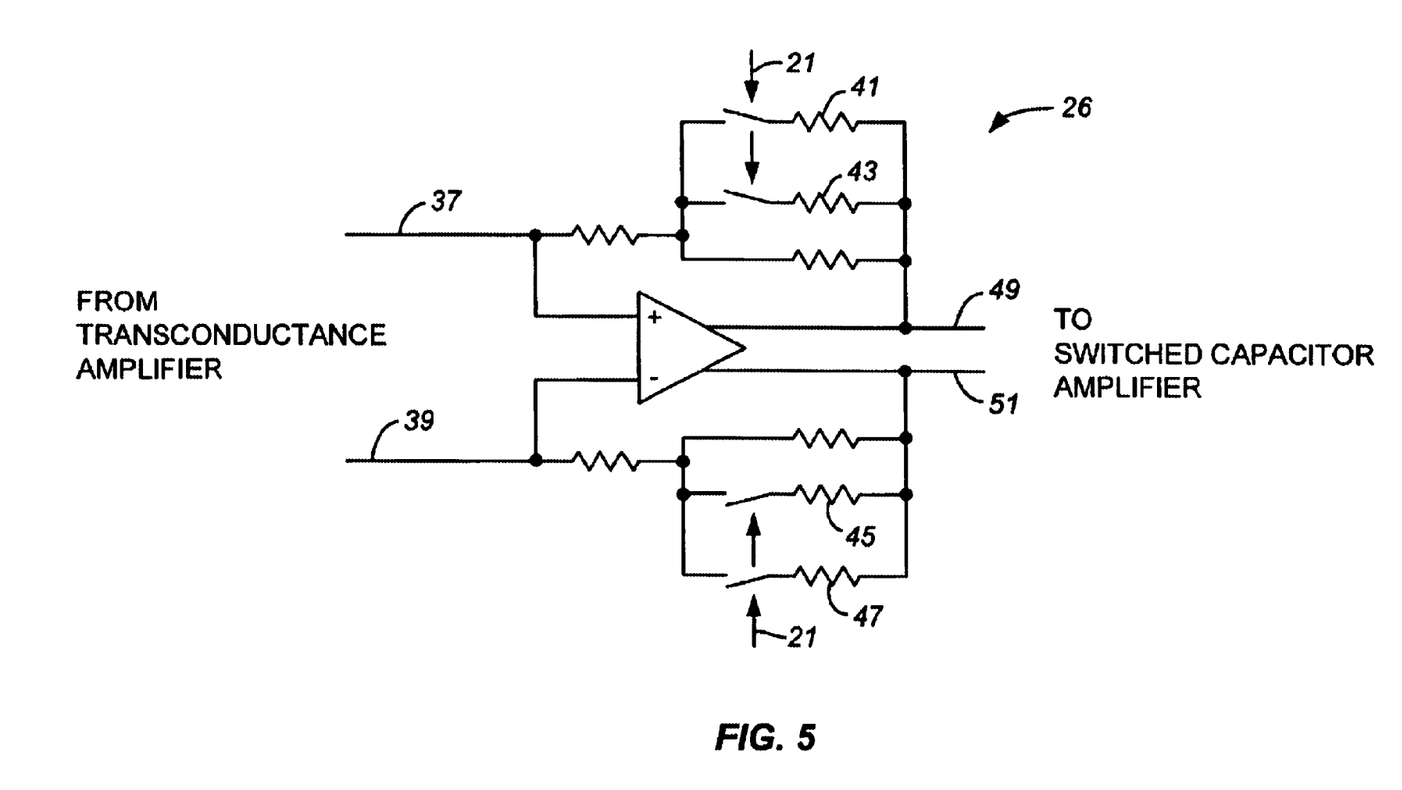
FIG. 5 is a diagram of the transimpedance amplifier of FIG. 1.

Transimpedance Amplifier. FIG. 5 shows one embodiment of a transimpedance amplifier 26. The output current of the transconductance amplifier is converted to a voltage by transimpedance amplifier 26 with programmable feedback resistors (41, 43, 45, 47), to allow for additional gain trimming. These programmable resistors are also in exponential ratios, and are programmed using select lines 21, as described in FIG. 1. This amplifier will therefore generate a low impedance, high bandwidth output of the original CCD input signal with a low noise content. This output signal (on lines 49, 51) is continuous in time, follows the CCD output signal with a gain determined by the selected gains of the transconductance and transimpedance amplifiers and has been corrected for pixel-to-pixel variations of the black reference level and other measurable offsets. This is then sampled by the switched capacitor amplifier 28.

Figure 6:
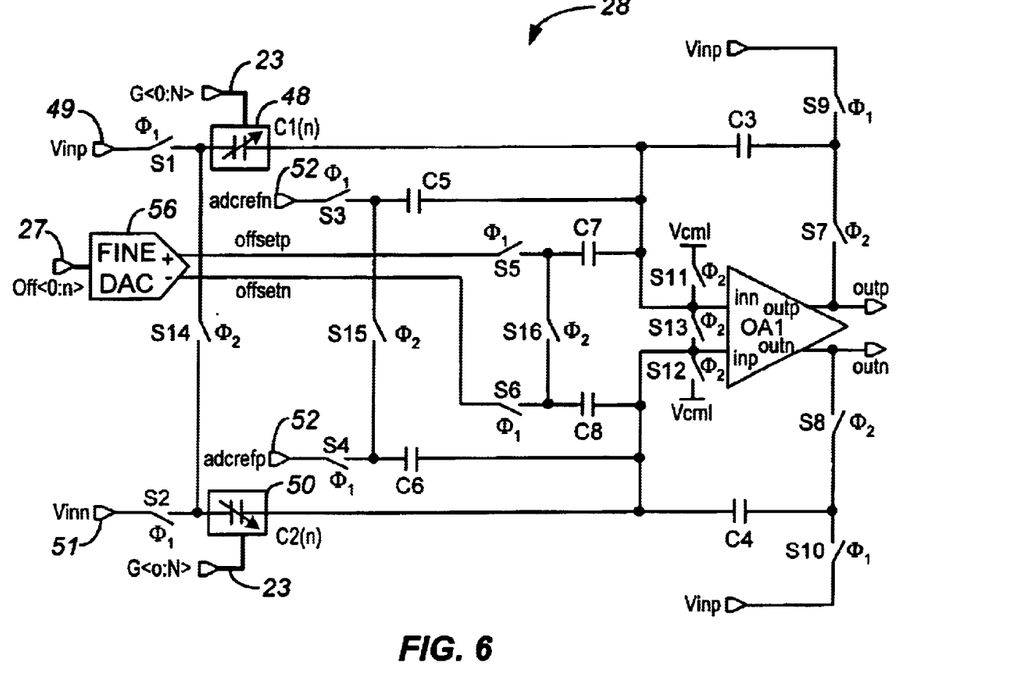
FIG. 6 is a diagram of a switched capacitor amplifier (SCA) used in FIG. 1.
Figure 7:
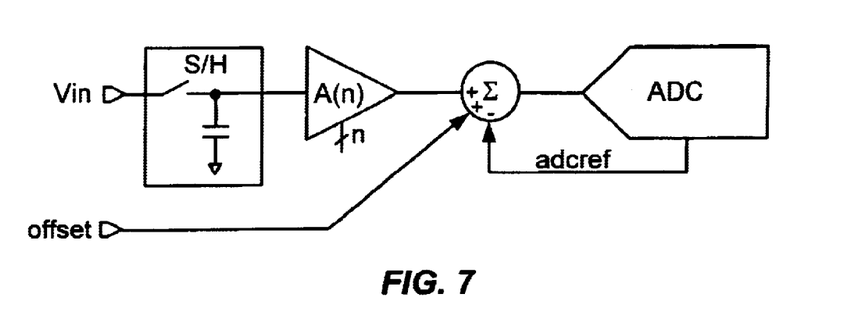
FIG. 7 is a high-level block diagram of an embodiment of the switched capacitor amplifier.
Figure 12:
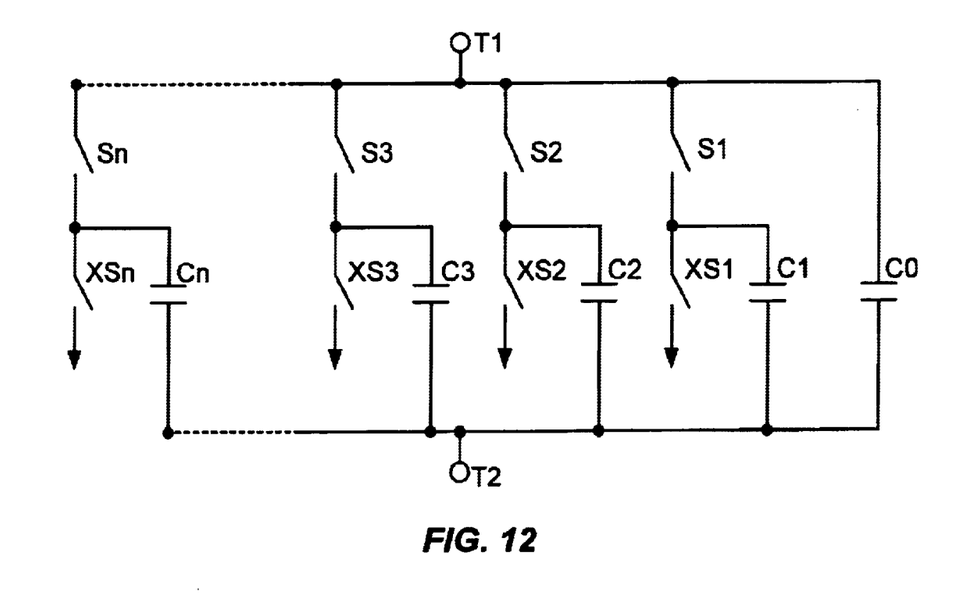
FIG. 12 is a diagram of one embodiment of elements 48 & 50 of FIG. 6.

Switched Capacitor Amplifier. The final stage of the AFE is a switched capacitor amplifier (SCA) designed to sum three separate input signals. A block diagram of the stage is shown in FIG. 7 and a complete circuit description in FIG. 6. It performs multiple functions on the CCD signal: programmable gain, sample and hold, level shifting, and offset correction. Each operation is required in order to make the signal suitable for digitization by the ADC. Foremost the purpose of the SCA is to provide the linear gain control required to complete the piece-wise linear gain transfer function. The gain applied to video signals 49 and 51 is programmed by select lines 23 which adjust the capacitance of variable capacitor blocks 48 and 50 (shown in more detail in FIG. 12). These variable capacitors consist of an array of n parallel capacitors n−1 of which being switchable to either signal ground or the SCA's video input. Linear gain control is achieved by the binary weighted values of capacitors 1 through n within the cap array of FIG. 12. (i.e. C2=2*C1, C3=2*C2, . . . Cn−2*C(n−1)).

The video signal has a duty-cycle between 25% and 50%. However, many ADCs require a 50% duty-cycle. The sample and holding action of the SCA increases the video signal duty-cycle to 50% or greater. Although the prior AFE stages have converted the single ended CCD signal into a differential video signal, the zero level of the video signal does not correspond with the zero signal level of most fully differential ADC converters which is typically −½ of the ADC's full scale input range. For this reason a level shift of the zero signal level is required in order to align the AFE's zero signal level with that of the ADC reference. This SCA architecture can perform this level shift particularly accurately over process, temperature and supply voltage changes by actually sampling the ADC reference and subtracting it directly from the video signal. This sampling is done by the reference voltage input on lines 52. The architecture allows this level shift to be subtracted without any dependence on the signal gain thus eliminating the need to scale the offset with SCA gain setting.

In the same manner as the level shift was combined with the video signal, additional offsets, such as for calibration of CCD black level, can be added or subtracted from the video signal as well. Although introduction of offsets for black level calibration at this point will necessitate calibration with changes in AFE gain, the post gain location allows for finer offset correction than can be achieved with pre-gain offset introduction. These offsets are controlled by lines 27, which provide an input to DAC 56, whose outputs are provided to the switched capacitor amplifier.

Figure 8:
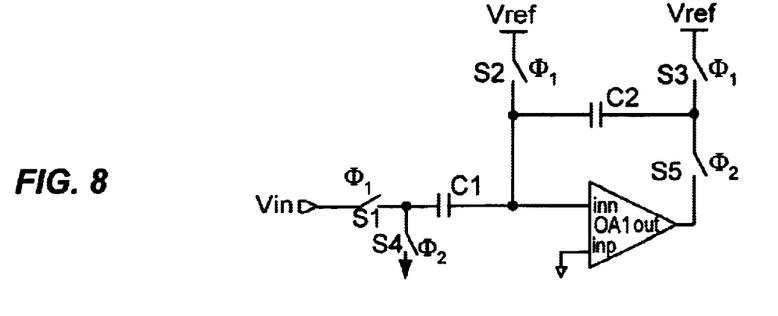
FIGS. 8, 9 and 10 are diagrams of three embodiments of SCA architectures useful for explaining the operation of the SCA of FIG. 6.
Figure 9:
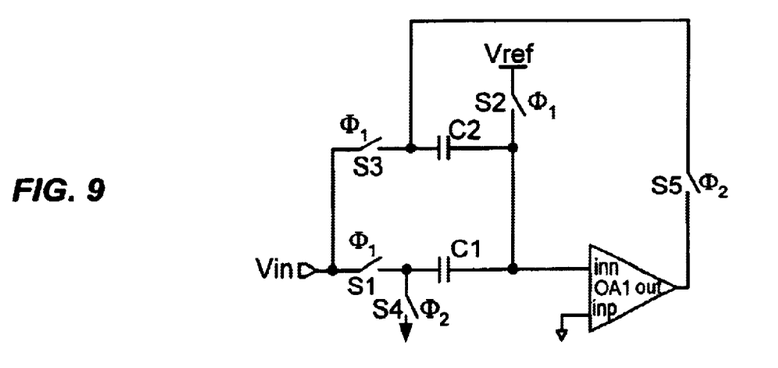
Figure 10:
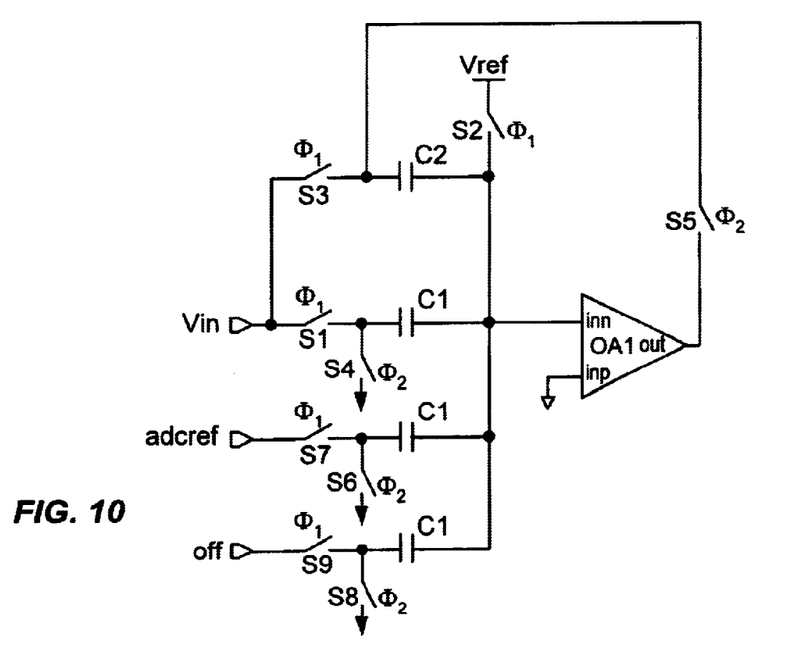
Figure 11:
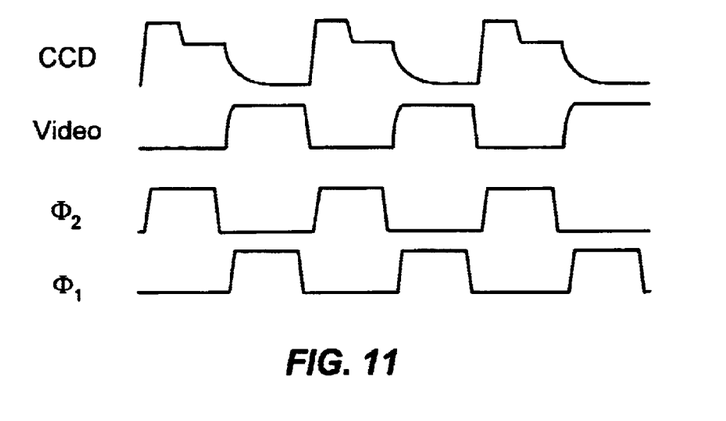
FIG. 11 is a timing diagram illustrating the operation of the circuits of FIGS. 6–10.

The actual mechanisms of the SCA's signal processing is most easily explained by analogy to simpler architectures. Three simple SCA architectures are shown in FIGS. 8, 9 and 10. The topologies are very similar in operation, but have slightly different transfer functions. The operation of the first two will be described in detail. The third will then be shown to be an amalgamation of the first two. Then the operation of the circuit of FIG. 6 will be easily explained as a fully differential implementation of that in FIG. 10. The timing diagram of FIG. 11 applies to FIGS. 6 through 10 and all switches are active high.

Refer now to FIG. 8, which is a very simple implementation of a sample and hold amplifier. As seen in the timing diagram of FIG. 11, a two-phase non-overlapping clock governs all of the switching. During $\Phi_1$, the first phase of the non-overlapping clock, switches S1, S2, and S3 are closed. The potential difference between voltages vin and vref is applied to capacitor C1 and a proportional charge stored on the C1. During $\Phi_2$ switches S4 and S5 are closed. The closing of S5 creates a negative feedback loop around OA1 and that of S4 places capacitor C1 between OA1's inverting input, inn, and ground. The charge stored on C1 during $\Phi_1$, hereafter called q1, now creates a potential difference between inn and inp. In response to the imbalance in its inputs the feedback amplifier created by OA1, C1 and C2 corrects the imbalance by transferring the charge stored on C1 to C2. This balances the potential on OA1's inputs and creates a voltage at OA1's output, vout, equal to q1 divided by C2. It can now be seen that the circuit of FIG. 8 acts as both a sample and hold and an amplifier as it has stored a charge, q1=Vin*C1, during $\Phi_1$, and then converted it to a scaled and held voltage at vout during $\Phi_2$ equal to q1/C2= Vin'*C1/C2; where the prime symbol added to Vin is used to indicate the voltage at node Vin during $\Phi_1$. To summarize, we have a circuit that samples a voltage during the first phase of a non-overlapping clock and reproduces a proportional voltage during the second phase of the non-overlapping clock. The transfer function of this circuit being Vout=Vin'*C1/C2.

The circuit of FIG. 9 is very similar in operation to that of FIG. 8. The main difference being that the voltage at node Vin during $\Phi_1$ is sampled on both C1 and C2. With a similar argument to that presented for the circuit of FIG. 8, it can be shown that the circuit of FIG. 9 also acts as a sample and hold amplifier, however with the transfer function vout=Vin' (1+C1/C2). The main advantage of this stage over the previous one being that it can create a higher gain with a lower feedback factor which can result in better bandwidth in the correct conditions.

In order to create an SCA with multiple inputs, additional voltage sampling capacitors are added between appropriate input voltages and inn in the circuit of FIG. 9. The resulting topology is shown in FIG. 10. The circuit of FIG. 10 can be viewed as a super-position of the circuits of FIGS. 8 and 9, and will behave as a summing sample and hold amplifier. It samples the voltages at nodes Vin, ADC ref, and offset during $\Phi_1$, scales each voltage either by C1/C2 or (1+C1/C2), depending on whether or not the feedback capacitor was used to sample the signal voltage, and produces a voltage equal to the sum of the scaled and sampled voltages at its output. The transfer function for the circuit of FIG. 10 is given in equation 1 below.

$$vout = Vin' \cdot \left(1 + \frac{C1}{C2}\right) + adcreff' \cdot \frac{C3}{C2} + offset' \cdot \frac{C4}{C2} \quad (1)$$

The circuit of FIG. 6 is simply a fully differential version of the circuit in FIG. 10 incorporating variable capacitors C1(n)–C2(n) in order to apply a variable voltage gain to the potential difference between vinp and vinn. Differential input voltages vinp-vinn, adcreffn-adcreffp, and offp-offn are sampled across the series connected capacitor pairs C1–C4, C5–C6, and C7–C8, respectively, during $\Phi_1$. During $\Phi_2$, the charges stored on caps C1–C8 are transferred via negative feedback onto capacitors C3–C4, creating a differential output voltage proportional to the sum of the differential input voltages. The transfer function of the circuit is given in equation 2 below, where it is assumed that capacitor C1(n)=C2(n), C3=C4, C5=C6, and C7=C8.

$$outp - outn = (vinp' - vinn') \cdot \left(1 + \frac{C1(n)}{C3}\right) + \quad (2)$$
$$(adcreffn' - acdreffp') \cdot \frac{C5}{C3} + (offp' - offn') \cdot \frac{C7}{C3}$$

Inspection of equation 2 makes clear the implementation and function of the SCA. The first term of equation 2 describes the mechanism by which programmable gain is applied to the video signal. The second term shows the summation of the ADC full-scale reference with the video signal in order to align the zero video level and the ADC zero reference level. The last term shows the summation of an offset calibration term which could be generated by either a digital or analog offset feedback control loop.

As will be understood by those of skill in the art, the present invention may be embodied in other specific forms without departing from the essential characteristics thereof. For example, a single voltage reference could be used for the black reference sampler rather than the two references illustrated in FIG. 3. Accordingly, the foregoing description is intended to be illustrative, but not limiting, of the scope of the invention which is set forth in the following claims.

What is claimed is:

1. A programmable amplifier comprising:
a programmable transconductance amplifier;
a programmable transimpedance amplifier coupled to an output of said programmable transconductance amplifier; and
a programmable switched capacitor amplifier coupled to an output of said programmable transimpedance amplifier.

2. The amplifier of claim 1 wherein said amplifier is in an analog front end for an imaging circuit, and further comprising:
a differential input;
a DC restore circuit coupled to said differential input; and
a black reference sampler circuit having an input coupled to said DC restore circuit and an output coupled to an input of said transconductance amplifier.

3. The amplifier of claim 2 further comprising:
a coarse offset correction input coupled to said black reference sampler circuit; and
a fine offset correction input coupled to said switched capacitor amplifier.

4. The amplifier of claim 1 further comprising:
a gain selection circuit having a user controlled input, and an output connected to gain control elements in said amplifiers, said amplifiers having programmable gains such that, responsive to said selection circuit, multiples of a desired gain are controlled by said transconductance and transimpedance amplifiers, and fine settings of said desired gain between said multiples are controlled by said switched capacitor amplifier.

5. The amplifier of claim 4 wherein:
said gain control elements in said transconductance and transimpedance amplifiers comprise a plurality of resistors switchably connectable in a feedback loop of said amplifiers.

6. The amplifier of claim 1 further comprising:
an analog to digital converter having an input coupled to an output of said switched capacitor amplifier and having a reference voltage;
said switched capacitor amplifier having reference nodes connected to said reference voltage of said analog to digital converter so that a zero level of a signal in said switched capacitor amplifier is matched to a zero level of said input of said analog to digital converter.

7. The circuit of claim 2 wherein said black reference sampler circuit comprises:
a first capacitor coupled on a first line to a first differential output of said DC restore clamp circuit,
a second capacitor coupled on a second line to a second differential output of said DC restore clamp circuit,
a voltage reference, and
first and second switches coupling said voltage reference to said first and second capacitors.

8. The circuit of claim 7 wherein said voltage reference comprises first and second offset programmable voltage references for providing a coarse, pre-gain offset.

9. A programmable amplifier comprising:
a programmable transconductance amplifier;
a programmable transimpedance amplifier coupled to an output of said programmable transconductance amplifier;
a programmable switched capacitor amplifier coupled to an output of said programmable transimpedance amplifier;
a differential input;
a DC restore circuit coupled to said differential input;
a black reference sampler circuit having an input coupled to said DC restore circuit and an output coupled to an input of said transconductance amplifier;
a coarse offset correction input coupled to said black reference sampler circuit; and
a fine offset correction input coupled to said switched capacitor amplifier.

10. A programmable amplifier comprising:
a programmable transconductance amplifier;
a programmable transimpedance amplifier coupled to an output of said programmable transconductance amplifier;
a programmable switched capacitor amplifier coupled to an output of said programmable transimpedance amplifier;
a differential input;
a DC restore circuit coupled to said differential input;
a black reference sampler circuit having an input coupled to said DC restore circuit and an output coupled to an input of said transconductance amplifier; and
a gain selection circuit having a user controlled input, and an output connected to gain control elements in said amplifiers, said amplifiers having programmable gains such that, responsive to said selection circuit, multiples of a desired gain are controlled by said transconductance and transimpedance amplifiers, and fine settings of said desired gain between said multiples are controlled by said switched capacitor amplifier.

11. A programmable amplifier comprising:
a programmable switched capacitor amplifier; and
an analog to digital converter having an input coupled to an output of said switched capacitor amplifier and having a reference voltage;
said switched capacitor amplifier having reference nodes connected to said reference voltage of said analog to digital converter so that a zero level of a signal in said switched capacitor amplifier is matched to a zero level of said input of said analog to digital converter.

12. The programmable amplifier of claim 11 further comprising:
a programmable transconductance amplifier;
a programmable transimpedance amplifier having an input coupled to an output of said programmable transconductance amplifier, and an output coupled to an input of said switched capacitor amplifier.

13. The programmable amplifier of claim 12 further comprising:
a differential input;
a DC restore circuit coupled to said differential input; and
a black reference sampler circuit having an input coupled to said DC restore circuit and an output coupled to an input of said transconductance amplifier.

* * * * *